(12) United States Patent
Yoo (10) Patent No.: US 9,159,742 B2
(45) Date of Patent: Oct. 13, 2015

(54) NON-VOLATILE MEMORY DEVICE (71) Applicant: SK hynix Inc., Gyeonggi-do (KR)

(72) Inventor: Deung-Kak Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/081,699

(22) Filed: Nov. 15, 2013

(65) Prior Publication Data

US 2014/0374817 A1   Dec. 25, 2014

(30) Foreign Application Priority Data

Jun. 21, 2013 (KR) .................. 10-2013-0071647

(51) Int. Cl.
*H01L 29/66* (2006.01)
*H01L 27/115* (2006.01)
*G11C 16/04* (2006.01)
*H01L 29/792* (2006.01)

(52) U.S. Cl.
CPC ...... *H01L 27/11582* (2013.01); *G11C 16/0483* (2013.01); *H01L 27/11575* (2013.01); *H01L 27/1157* (2013.01); *H01L 29/7926* (2013.01)

(58) Field of Classification Search
CPC .............. H01L 29/7926; H01L 27/11582; H01L 27/115; G11C 16/0466; G11C 16/10; G11C 16/0483; G11C 16/3427
See application file for complete search history.

(56) References Cited

U.S. PATENT DOCUMENTS

| | | | | |
|---|---|---|---|---|
| 8,212,298 B2* | 7/2012 | Masuoka et al. | ............... | 257/300 |
| 2002/0149081 A1* | 10/2002 | Goda et al. | ..................... | 257/510 |
| 2010/0020617 A1* | 1/2010 | Oh et al. | .................. | 365/185.23 |
| 2013/0163345 A1* | 6/2013 | Ahn et al. | ................ | 365/185.23 |
| 2014/0043915 A1* | 2/2014 | Choi | ......................... | 365/185.25 |
| 2014/0063943 A1* | 3/2014 | Nagashima | .............. | 365/185.08 |

FOREIGN PATENT DOCUMENTS

KR    10-201113700    * 2/2011

* cited by examiner

*Primary Examiner* — A. Sefer
(74) *Attorney, Agent, or Firm* — IP & T Group LLP (57) ABSTRACT

A non-volatile memory device includes: a semiconductor pillar stretched perpendicularly to a substrate; a plurality of memory cells stacked along the semiconductor pillar; a bit line coupled with a first end of the semiconductor pillar; a first source line coupled with one of the first end and a second end of the semiconductor pillar; a second source line disposed over the bit line and the first source line; a first switch having a first end coupled with the first source line and a second end coupled with a first voltage supplier, and controlling whether to supply a first voltage to the first source line; and a second switch having a first end coupled with the first source line and a second end coupled with the second source line, and controlling whether or not to supply a second voltage supplied from the second source line to the first source line.

19 Claims, 6 Drawing Sheets

NON-VOLATILE MEMORY DEVICE

CROSS-REFERENCE TO RELATED APPLICATIONS

The present application claims priority of Korean Patent Application No. 10-2013-0071647, filed on Jun. 21, 2013, which is incorporated herein by reference in its entirety.

BACKGROUND

1. Field

Exemplary embodiments of the present invention relate to a non-volatile memory device, and more particularly, to a non-volatile memory device including a plurality of memory cells that are stacked vertically from a substrate.

2. Description of the Related Art

A non-volatile memory device retains data stored therein even though a power supply is cut off. At present, various non-volatile memory devices such as a NAND (not-and) flash memory device are widely used.

As limits in the integration degree of a two-dimensional non-volatile memory device where memory cells are formed in a single layer over a silicon substrate are reached, researchers and the industry are developing various three-dimensional non-volatile memory devices in which a plurality of memory cells are stacked vertically from a silicon substrate. Among them is a memory device having a structure in which a plurality of memory cells are stacked along U-shape channels and resulting in bit lines and source lines being disposed over the stacked memory cells.

SUMMARY

Exemplary embodiments of the present invention are directed to a non-volatile memory device that may have improved operation characteristics.

In accordance with an exemplary embodiment of the present invention, a non-volatile memory device includes: a semiconductor pillar stretched perpendicularly to a substrate; a plurality of memory cells stacked along the semiconductor pillar; a bit line coupled with a first end of the semiconductor pillar; a first source line coupled with one of the first end and a second end of the semiconductor pillar; a second source line disposed over the bit line and the first source line; a first switch having a first end coupled with the first source line and a second end coupled with a first voltage supplier, and controlling whether or not to supply a first voltage to the first source line; and a second switch having a first end coupled with the first source line and a second end coupled with the second source line, and controlling whether or not to supply a second voltage supplied from the second source line to the first source line.

In accordance with an exemplary embodiment of the present invention, a non-volatile memory device includes: a memory string including a plurality of memory cells that are serially coupled between a bit line and a source line; a first switch having a first end coupled with the source line and a second end coupled with a source line voltage supplier for supplying a source line voltage required for the source line during a program operation, an erase operation, or a read operation, and controlling whether or not to supply the source line voltage to the source line; and a second switch having a first end coupled with the source line and a second end coupled with a ground voltage supplier for supplying a ground voltage, and controlling whether or not to supply the ground voltage to the source line.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

When a first layer is referred to as being "on" a second layer or "on" a substrate, it not only refers to a case where the first layer is formed directly on the second layer or the substrate but also a case where a third layer exists between the first layer and the second layer or the substrate. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereafter, a non-volatile memory device in accordance with an embodiment of the present invention is described with reference to FIGS. 1 to 5.

Figure 1:
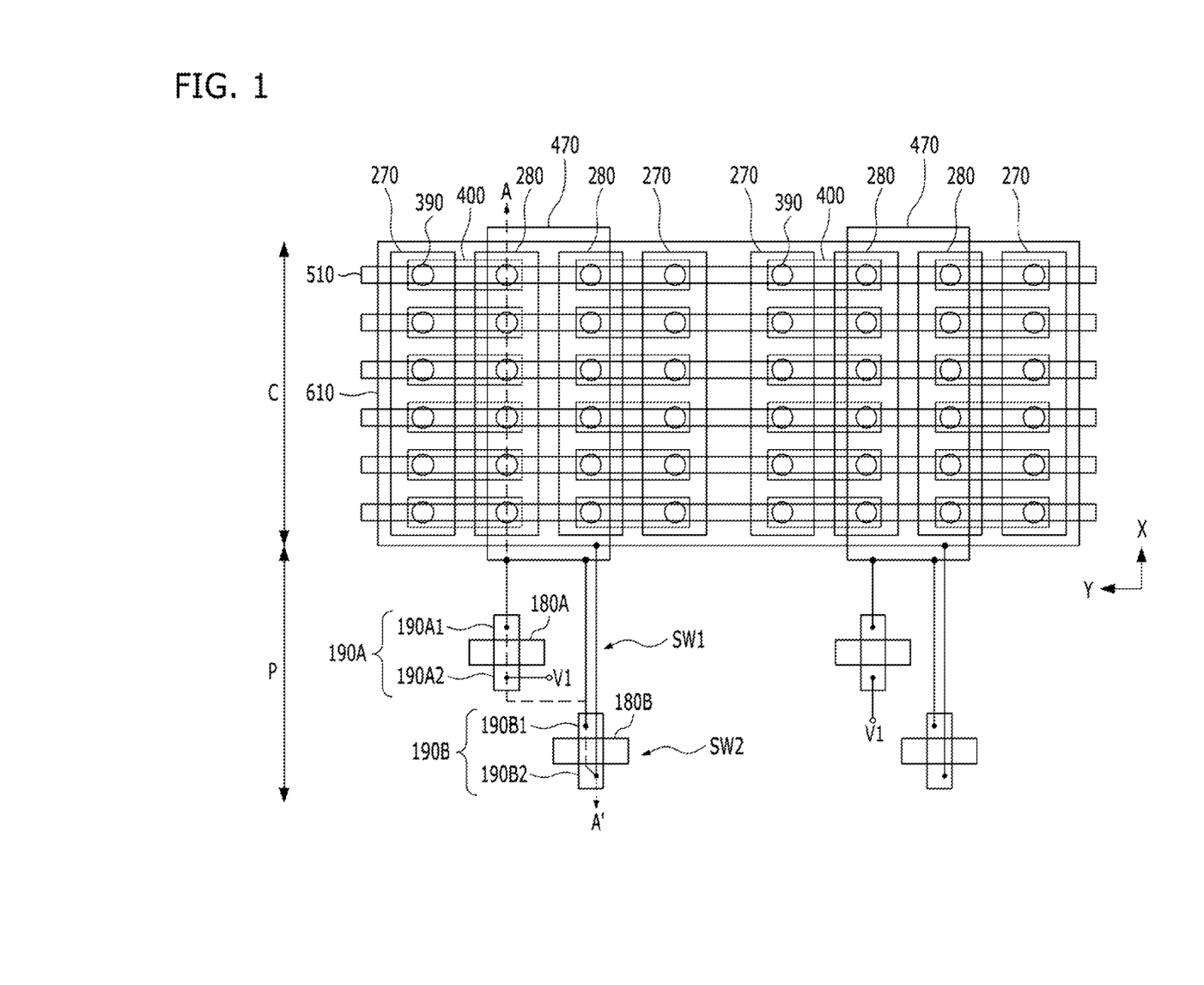
FIGS. 1 to 3 illustrate a non-volatile memory device in accordance with an exemplary embodiment of the present invention.
Figure 2:
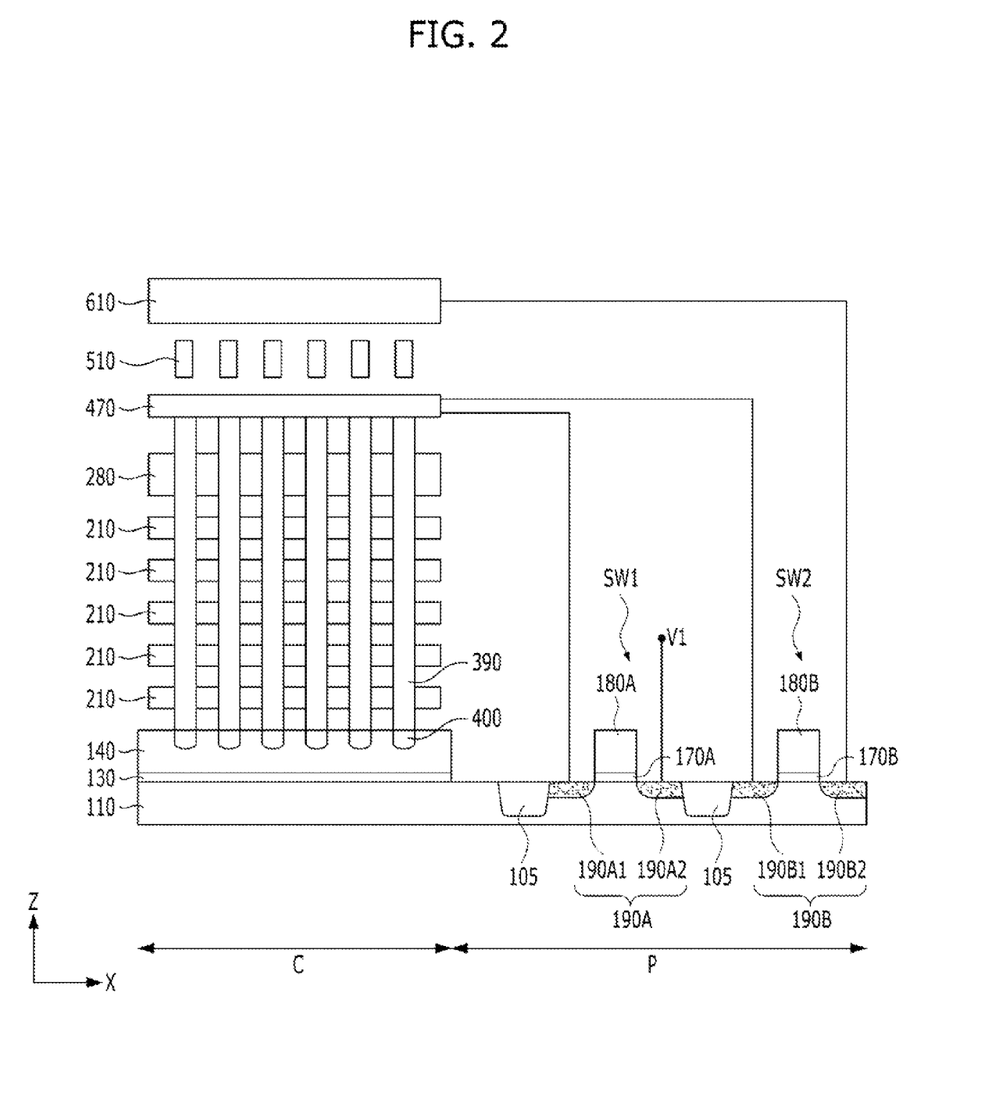
Figure 3:
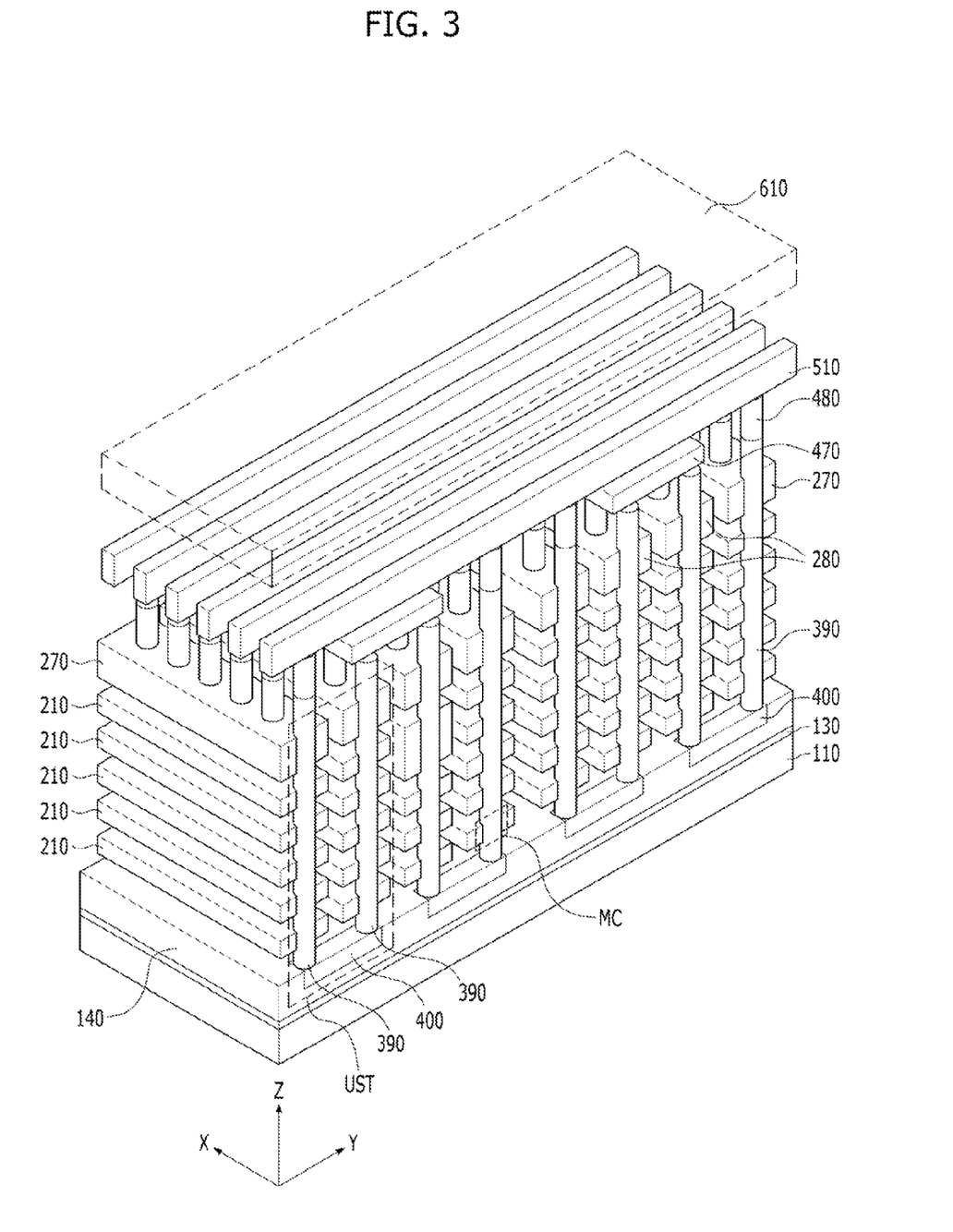
Figure 4:
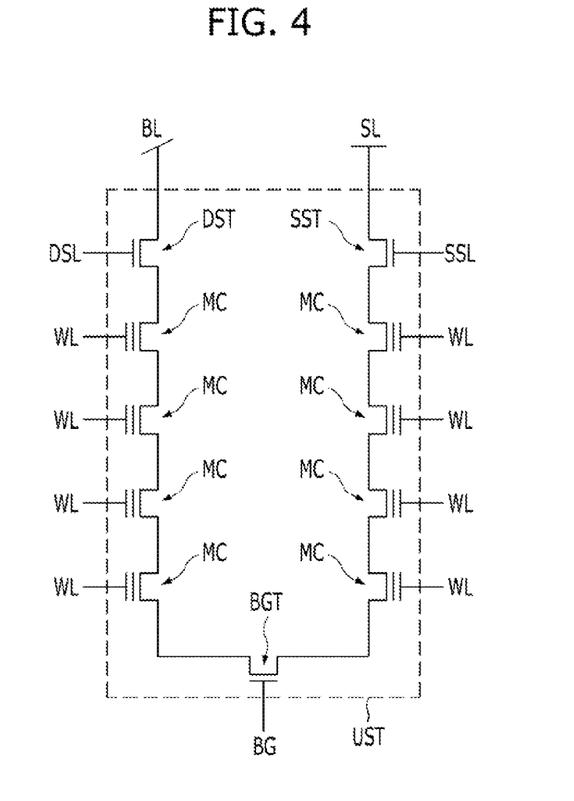
FIG. 4 is a circuit diagram illustrating a memory string shown in FIG. 3.
Figure 5:
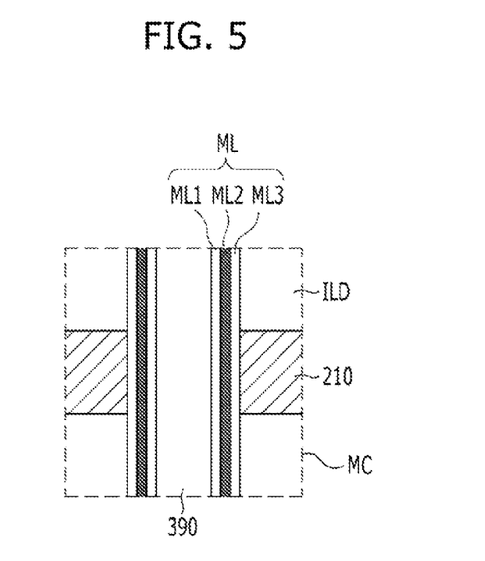
FIG. 5 is a magnified view illustrating a memory cell shown in FIG. 3.

FIGS. 1 to 3 illustrate a non-volatile memory device in accordance with an exemplary embodiment of the present invention. FIG. 4 is a circuit diagram illustrating a memory string UST shown in FIG. 3. FIG. 5 is a magnified view of a memory cell MC shown in FIG. 3. In particular, FIG. 1 is a plan view of the non-volatile memory device, and FIG. 2 is a cross-sectional view of the non-volatile memory device taken along a line A-A' of FIG. 1. FIG. 3 is a perspective view of a first region C shown in FIG. 1.

Hereafter, the non-volatile memory device in accordance with the exemplary embodiment of the present invention is described by referring to FIGS. 1 to 3 and if necessary, referring to FIG. 4 or 5 together. Further, it is assumed for convenience in description that the direction where word lines 210 are stretched in parallel to a substrate 110 is an X direction and crossing the X direction is a Y direction, whereas the direction perpendicular to the substrate 110 is a Z direction.

Referring to FIGS. 1 to 3, the substrate 110 including the first region C and a second region P is provided. The first region C is a cell region in which a plurality of memory cells MC are disposed, and the second region P is a peripheral circuit region in which a structure (e.g., a switch) for controlling the constituent elements in the first region C is disposed. The substrate 110 may be formed of a semiconductor material such as silicon.

Constituent elements in the first region C are now described.

An insulation layer 130 is disposed over the substrate 110 of the first region C. The insulation layer 130 may include an insulation material such as oxide and nitride, and the insulation layer 130 insulates the substrate 110 from a back gate layer 140, or when the back gate layer 140 is omitted, it insulates the substrate 110 from connecting units 400.

Semiconductor pillars 390 stretched in the Z direction and arrayed in a matrix form in the X direction and the Y direction may be disposed over the insulation layer 130. Herein, the semiconductor pillars 390 that are adjacent to each other in the Y direction and coupled with each other by the same connecting unit 400 are referred to as a pair of semiconductor pillars 390. The connecting units 400 are disposed below the semiconductor pillars 390, and each connecting unit couples the pair of semiconductor pillars 390 with each other by simultaneously contacting the pair of semiconductor pillars 390 that are adjacent in the Y direction. To this end, the connecting units 400 may have a bar shape, each having a long axis in the Y direction and a short axis in the X direction on a plan view. The semiconductor pillars 390 may be formed of a semiconductor material such as polysilicon, and the connecting units 400 may be formed of a semiconductor material such as polysilicon, or a conductive material such as metal and metal nitride. The pair of semiconductor pillars 390 and a connecting unit 400 for coupling the pair of semiconductor pillars 390 form a shape similar to alphabet U, and they may function as a channel of a memory string UST.

The back gate layer 140 is disposed over the insulation layer 130 to surround the sides and bottom of each connecting unit 400. The back gate layer 140 may be formed of a conductive material, and a gate insulation layer (not shown) may be interposed between the back gate layer 140 and the connecting units 400. However, the concept and spirit of the present invention are not limited to that form and the back gate layer 140 may contact a portion of each connecting unit 400 with a gate insulation layer in between. One connecting unit 400, the back gate layer 140 contacting the connecting unit 400, and the gate insulation layer interposed between them may form one back gate transistor (refer to BGT of FIG. 4). The back gate transistor BGT controls a connection between the pair of semiconductor pillars 390. However, when the connecting units 400 are formed of a conductive material such as metal and metal nitride, the back gate layer 140 may be omitted. This is due to each connecting unit 400 being capable of directly connecting the pair of semiconductor pillars 390 even without the back gate layer 140.

One of the pair of semiconductor pillars 390 may be coupled with a bit line 510 and the other may be coupled with a source line 470. Along the semiconductor pillar 390 coupled with the bit line 510, a plurality of word lines 210 and a drain selection line 270 are stacked. Along the semiconductor pillar 390 coupled with the source line 470, the plurality of word lines 210 and a source selection line 280 are stacked. The word lines 210, the drain selection line 270, and the source selection line 280 may be stretched in the X direction while surrounding the semiconductor pillars 390. An inter-layer dielectric layer (not shown) may be interposed between the word lines 210 and between the word lines 210 and the drain selection line 270 and the source selection line 280. The number of the word lines 210 and the number of the drain selection lines 270 and the source selection lines 280 may be diversely modified.

A memory layer (refer to ML of FIG. 5) may be interposed between the word lines 210 and the semiconductor pillars 390. One semiconductor pillar 390, one word line 210 contacting the semiconductor pillar 390, and the memory layer ML interposed between the semiconductor pillar 390 and the word line 210 may form one memory cell MC. To describe the memory layer ML in detail with reference to FIG. 5, the memory layer ML may include a tunnel insulation layer ML1, a charge blocking layer ML3, and a charge storing layer ML2. The tunnel insulation layer ML1 is disposed on a side of the semiconductor pillar 390 and makes it possible to perform tunneling of charges. The charge blocking layer ML3 is disposed on a side of the word line 210 and blocks off the transfer of charges. The charge storing layer ML2 is interposed between the tunnel insulation layer ML1 and the charge blocking layer ML3 and stores charges. The tunnel insulation layer ML1 and the charge blocking layer ML3 may include an oxide layer, and the charge storing layer ML2 may be a nitride to trap charges. A data of '0' or '1' may be stored in the memory cell MC according to whether charges are stored in or discharged from the charge storing layer ML2. Although FIG. 5 shows a case where the memory layer ML surrounds each semiconductor pillar 390, the scope and spirit of the present invention are not limited to it, and the memory layer ML may be diversely formed as long as it is interposed between the respective word line 210 and the respective semiconductor pillar 390.

A gate insulation layer (not shown) may be interposed between the drain selection line 270 and the semiconductor pillar 390 and between the source selection line 280 and the semiconductor pillar 390. The gate insulation layer may be a single layer of an oxide layer or a nitride layer, or it may be a stacked layer of an oxide layer and a nitride layer. The gate insulation layer may be formed to have substantially the same layer as the memory layer ML. One semiconductor pillar 390, the drain selection line 270 contacting the semiconductor pillar 390, and the gate insulation layer in between may form one drain selection transistor (refer to DST of FIG. 4). Further, one semiconductor pillar 390, the source selection line 280 contacting the semiconductor pillar 390 and the gate insulation layer in between may form one source selection transistor (refer to SST of FIG. 4).

As illustrated in FIG. 4, one memory string UST has an alphabet U-shape, and one memory string UST may include a plurality of memory cells MC and the drain selection transistor DST, which are stacked and serially coupled along one of the pair of semiconductor pillars 390, includes a plurality of memory cells MC and the source selection transistor SST, which are stacked and serially coupled along the other of the pair of semiconductor pillars 390, and the back gate transistor BGT for controlling the connection between the pair of semiconductor pillars 390 (refer to FIG. 4). This exemplary embodiment of the present invention shows a case where 6 memory strings UST are arrayed in the X direction and 4 memory strings UST are arrayed in the Y direction, but the scope and spirit of the present invention are not limited to this case. The number of memory strings UST arrayed in the X direction and the Y direction may be diversely modified.

The bit line 510 is stretched in the Y direction while being coupled with the upper end of one of the pair of semiconductor pillar 390 (hereinafter, referred to as a 'first semiconductor pillar 390'), and the source line 470 is stretched in the X direction while being coupled with the upper end of the other of the pair of semiconductor pillar 390 (hereinafter, referred to as a 'second semiconductor pillar 390'). Herein, the bit line 510 may be disposed over the source line 470, and in this case, the bit line 510 may be coupled with the first semiconductor pillar 390 with a conductive contact 480 interposed between the bit line 510 and the first semiconductor pillar 390. Additionally, the source line 470 may be directly coupled with the second semiconductor pillar 390. Each of the bit line 510 and the source line 470 may be formed of a low-resistance material such as metal.

In this embodiment of the present invention, one source line 470 is coupled with first ends of two memory strings UST that are adjacent to the source line 470 in the Y direction, and one bit line 510 is coupled with second ends of the two memory strings UST that are arrayed in the Y direction. The memory strings UST that are arrayed in the X direction may be respectively coupled with a corresponding one of the bit lines 510. In this embodiment of the present invention, the memory strings UST coupled with one source line 470 may form one memory block. Although the drawing shows two memory blocks, the scope and spirit of the present invention are not limited to two memory blocks.

An additional source line 610 is disposed over the source fine 470 and the bit line 510. The additional source line 610 may be formed of a conductive material such as metal and metal nitride. The additional source line 610 supplies a target voltage to the source line 470, but it is not directly coupled with the source line 470. The additional source line 610 has one end coupled with a second switch SW2 which controls a connection or disconnection between the additional source line 610 and the source line 470. The additional source line 610 may be formed to cover all the memory blocks. In this embodiment of the present invention, the additional source line 610 is illustrated to have a planar shape, but the scope and spirit of the present invention are not limited to a planar shape. The additional source line 610 may have diverse forms such as a mesh form.

Hereafter, the constituent elements of the second region P is described.

A first switch SW1 and the second switch SW2 may be disposed over the substrate 110 of the second region P.

In this embodiment of the present invention, the first switch SW1 may be a transistor having a first gate electrode 180A and first junctions 190A formed on both sides of the first gate electrode 180A. To be specific, the first gate electrode 180A may be formed over an active region that is defined by an isolation layer 105 in the substrate 110 of the second region P, and a first gate insulation layer 170A may be interposed between the active region and the first gate electrode 180A. The first junctions 190A may be formed in the active region on both sides of the first gate electrode 180A. For convenience in description, the first junction 190A on one side of the first gate electrode 180A is referred to as a first source 190A1 and the first junction 190A on the other side of the first gate electrode 180A is referred to as a first drain 190A2. The positions of the first source 190A1 and the first drain 190A2 may be switched with each other.

Similarly, the second switch SW2 may be a transistor having a second gate electrode 180B and second junctions 190B on both sides of the second gate electrode 180B. A second gate insulation layer 170B may be interposed between the active region and the second gate electrode 180B. The second junctions 190B may include a second source 190B1 and a second drain 190B2.

Herein, the first source 190A1 of the first switch SW1 may be electrically connected to the source line 470, and the first drain 190A2 may be electrically connected to a predetermined voltage supplier (not shown) to receive a given voltage V1 for controlling the source line 470. The electrical connection between the first source 190A1 and the source line 470 is simply represented by a line, but the first source 190A1 and the source line 470 may be substantially connected through a combination of diverse shapes of conductive patterns, for example, a combination of contacts and lines. When the first switch SW1 is turned on in response to a voltage inputted to the first gate electrode 180A of the first switch SW1, the given voltage V1 supplied from the aforementioned voltage supplier may be supplied to the source line 470.

Furthermore, the second source 190B1 of the second switch SW2 may be electrically connected to the source line 470, and the second drain 190B2 may be electrically connected to the additional source line 610. The electrical connections between the second source 190B1 and the source line 470 and between the second drain 190B2 and the additional source line 610 are represented by lines, but they may be substantially connected through a combination of diverse shapes of conductive patterns, for example, a combination of contacts and lines. When the second switch SW2 is turned on in response to a voltage inputted to the second gate electrode 180B of the second switch SW2, the target voltage may be supplied to the source line 470 from the additional source line 610.

Hereafter, for convenience in description, the given voltage V1 inputted to the source line 470 through the first switch SW1 is referred to as a first voltage and a first voltage supplier is coupled with the first drain 190A2 of the first switch SW1. Further, the target voltage inputted to the source line 470 through the second switch SW2 is referred to as a second voltage, and the additional source line 610 coupled with the second drain 190B2 of the second switch SW2 includes a second voltage supplier.

Although this embodiment of the present invention exemplarily illustrates the first switch SW1 and the second switch SW2 as transistors, the scope and spirit of the present invention are not limited this embodiment. The first switch SW1 may be any structure that may control the connection and disconnection between the source line 470 and the first voltage supplier. Further, the second switch SW2 may be any structure that may control the connection and disconnection between the source line 470 and the additional source line 610.

When program/erase/read (or verification) operations are performed in the above-described non-volatile memory device, the operation characteristics may be improved.

The erase operation is described with reference to FIGS. 1 to 5 and the following Table 1.

TABLE 1

| | Selected Memory Block | | Unselected Memory Block | | First Voltage | Second Voltage |
|---|---|---|---|---|---|---|
| | SW1 | SW2 | SW1 | SW2 | Supplier | Supplier |
| Erase | On | off | off | Off | Verase | GND |

In this embodiment of the present invention, the erase operation may be performed on the basis of a memory block, that is on the unit of the source line 470. Whereas the erase operation is performed onto the memory cells MC of a memory string UST coupled with a selected source line 470, the erase operation may not be performed onto the memory cells MC of a memory string UST coupled with an unselected source line 470, i.e., an unselected memory block. In particular, during the erase operation, erase disturbance in which the memory cells MC of the unselected memory block are erased may be prevented from occurring. This is due to the first switch SW1 being coupled with each source line 470 to individually control whether or not an erase voltage Verase is supplied to each source line 470.

Specifically, during the erase operation, the first voltage supplier supplies the erase voltage Verase. The erase voltage Verase may be a high voltage, e.g., approximately 20V.

In this state, the erase voltage Verase is supplied to the selected source line 470 by turning on the first switch SW1 coupled with the selected source line 470, and a voltage that is much lower than the erase voltage Verase, e.g., approximately 0V, may be supplied to the word lines 210 of the selected memory block, and a voltage that is lower than the erase voltage Verase by a predetermined level, i.e., approximately Verase-ΔV, may be supplied to the source selection line 280 of the selected memory block. Herein, the ΔV is a value that may cause a Gate Induced Drain Leakage (GIDL) current in the source selection transistor SST. The ΔV may range from approximately 5V to approximately 8V. As a result, the erase voltage Verase is supplied to the semiconductor pillar 390, which is the channel of the memory string UST coupled with the selected source line 470, and holes originating from the GIDL current are injected into the memory cells MC of the selected memory block based on the difference between the erase voltage Verase and the low voltage supplied to the word line 210 of the selected memory block. The erase operation of the selected memory block may be completed in this manner.

Since the first switch SW1 coupled with the unelected source line 470 is turned off, the unselected source line 470 is in a floating states. The word lines 210 of the unselected source line 470 are in the floating state as well. Therefore, the data of the memory cells MC of the unselected memory block may be protected from being erased. Without the first switch SW1 coupled with each source line 470, the erase voltage Verase may be supplied not only to the selected source line 470 but also to the unselected source line 470 to erase the memory cells MC of the unselected memory block, which is the erase disturbance. According to the exemplary embodiment of the present invention, the erase disturbance does not occur.

The second voltage supplier included in the additional source line 610 may supply a ground voltage GND, but the second switches SW2 may be turned off during the erase operation. Thus, it does not affect the erase operation.

The program operation is described with reference to FIGS. 1 to 5 and the following Table 2.

TABLE 2

|  | Selected Memory Block | | Unselected Memory Block | | First Voltage Supplier | Second Voltage Supplier |
| --- | --- | --- | --- | --- | --- | --- |
|  | SW1 | SW2 | SW1 | SW2 | | |
| Program | On | off | off | Off | Vcc | GND |

To program a selected memory cell MC, a low voltage, e.g., approximately 0V, may be supplied to the selected bit line 510 coupled with a selected memory string UST including the selected memory cell MC, and a voltage for turning on the drain selection transistor DST, e.g., a power source voltage Vcc, may be supplied to the drain selection line 270 included in the selected memory string UST, and a high voltage, e.g., approximately 20V, may be supplied to the selected word line 210 coupled with the selected memory cell MC. A pass voltage, e.g., approximately 10V, may be supplied to an unselected word line 210, and a positive voltage for preventing a program operation, e.g., the power source voltage Vcc, may be supplied to the unselected bit line 510. In this case, electrons are injected into the memory layer ML of the selected memory cell MC based on the difference between the high voltage supplied to the selected word line 210 and the low voltage supplied to the semiconductor pillar 390 through the selected bit line 510. The selected memory cell MC may be programmed in this manner.

During the program operation, a low voltage for isolating the memory string UST from the source line 470, e.g., approximately 0V, may be supplied to the source selection line 280. The first voltage supplier may supply the power source voltage Vcc, and the first switch SW1 coupled with the selected source line 470 may be turned on to supply the power source voltage Vcc to the selected source line 470. This is to prevent the occurrence of leakage current flowing toward the source line 470 during the program operation. The first switch SW1 coupled with the unselected source line 470 may be turned off.

The second voltage supplier included in the additional source line 610 may supply a ground voltage GND, but the second switches SW2 may be turned off during the program operation. Thus, it does not affect the program operation.

The read operation is described with reference to FIGS. 1 to 5 and the following Table 3.

TABLE 3

|  | SW1 | SW2 | First Voltage Supplier | Second Voltage Supplier |
| --- | --- | --- | --- | --- |
| Read or Verification | On | on | GND | GND |

To read a selected memory cell MC, the bit lines 510 are pre-charged with a predetermined voltage level, e.g., approximately 1V, and then a data stored in the selected memory cell MC may be read out by applying a read voltage Vread to the word line 210 coupled with the selected memory cell MC, applying a pass voltage to the other word lines 210, the source selection line 280, and the drain selection line 270, and sensing a change in the voltage level of the bit line 510.

Herein, the voltage level of the selected bit line 510 is changed depending on whether a current flows toward the source line 470. Therefore, the source line 470 has to be maintained at the ground voltage GND. The first voltage supplier may supply the ground voltage GND, and the first switch SW1 has to be turned on to supply the ground voltage GND to the source line 470.

Furthermore, the second voltage supplier coupled with one end of the second switch SW2, which is the additional source line 610, may supply the ground voltage GND, and the second switch SW2 may be turned on to supply the ground voltage GND to the source line 470.

The first and second voltage suppliers are used to supply the ground voltage GND as described above for the following reasons.

The current amount flowing to the source line 470 may be increased or decreased based on the program state of the memory cells MC during the read operation, and in this case, the voltage of the source line 470 may not be maintained at the ground voltage GND but varied, which is called a source line bouncing. When the source line bouncing occurs, the voltage level of the bit line 510 may not be lowered sufficiently and for that reason, the data of the selected memory cell MC may be erroneously read during the read operation. To prevent this erroneous read operation, the present embodiment maintains the source line 470 at the ground voltage GND not only by supplying the ground voltage GND through the first voltage supplier but also by additionally supplying the ground voltage GND through the additional source line 610. Therefore, it is possible to prevent the erroneous read operation.

The verification operation for reading out the data of a memory cell MC during the program operation may be performed in the same as the read operation.

Although the exemplary embodiment shown in FIGS. 1-5 illustrates a case where memory strings UST coupled with one source line 470 form one memory block, the scope and spirit of the present invention are not limited to it, and the number of the source lines 470 included in one memory block may be diversely modified. That is, one memory block may include memory strings UST coupled with two or more source lines 470. This will be described with reference to FIG. 6.

Figure 6:
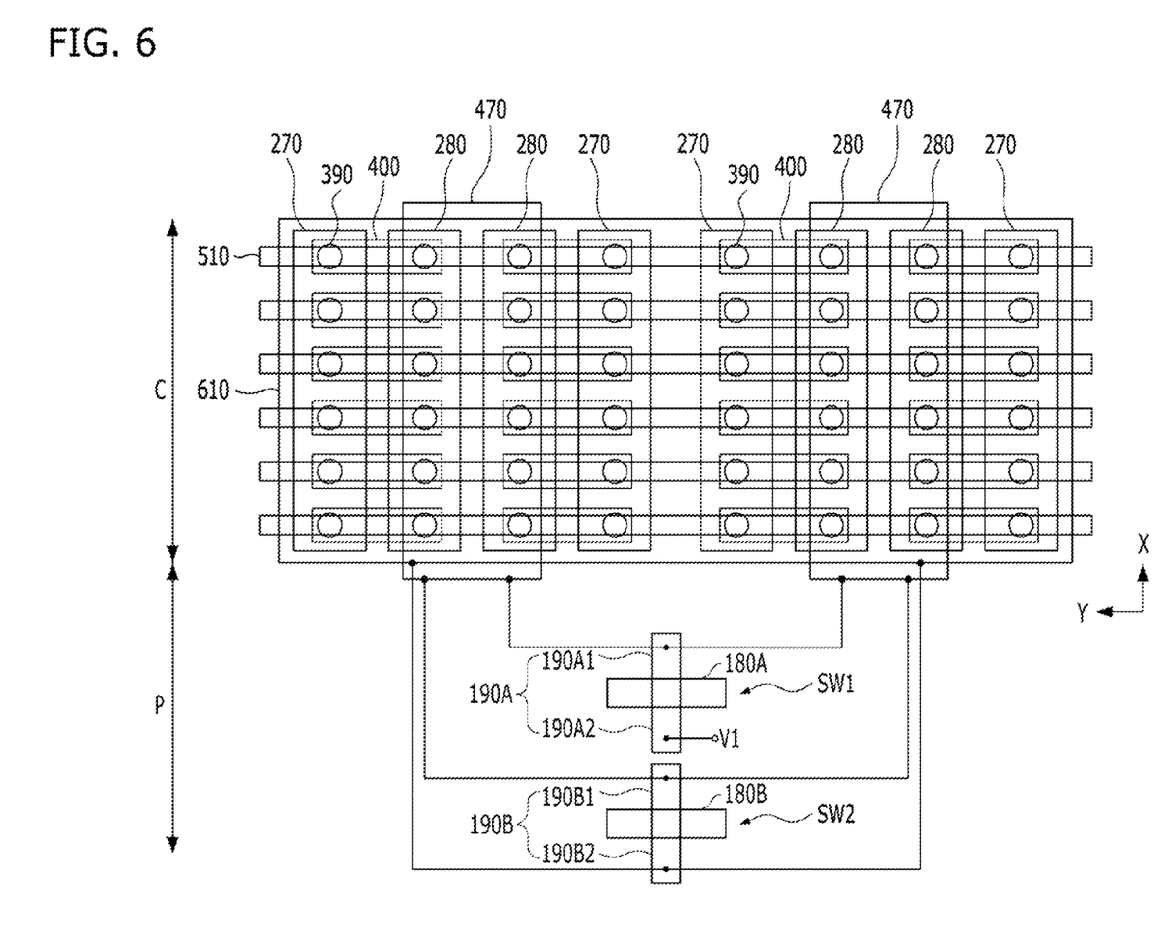
FIG. 6 is a plan view illustrating a non-volatile memory device in accordance with an exemplary embodiment of the present invention.

FIG. 6 is a plan view illustrating a non-volatile memory device in accordance with an exemplary embodiment of the present invention. This embodiment will be described hereafter mainly focusing on what is different from the exemplary embodiment shown in FIGS. 1-5. In FIGS. 1 and 6, like reference numerals are used to refer to the same elements.

Referring to FIG. 6, memory strings UST coupled with two source lines 470 may form one memory block, and thus FIG. 6 shows one memory block. A first switch SW1 and a second switch SW2 may be disposed for each memory block, and thus FIG. 6 shows one first switch SW1 and one second switch SW2. The two source lines 470 may be coupled in common with first junctions 190A of the first switch SW1. Further, the two source lines 470 may be coupled in common with second junctions 190B of the second switch SW2.

The non-volatile memory device of this embodiment shown in FIG. 6 performs an erase operation, a program operation, and a read operation in substantially the same manner as that of the exemplary embodiment shown in FIGS. 1-5. For example, when the memory block of FIG. 6 is a selected memory block, the first switch SW1 may be turned on and the second switch SW2 may be turned off in the program operation or the erase operation. Conversely, when the memory block of FIG. 6 is an unselected memory block, the first switch SW1 and the second switch SW2 may be turned off in the program operation or the erase operation.

In summary, a memory block may include two or more source lines 470. In this case, the source lines 470 included in one memory block may be coupled in common with one first switch SW1 and coupled in common with one second switch SW2. However, the scope and spirit of the present invention are not limited to it, and the first switch SW1 and the second switch SW2 may be coupled with each of the multiple source lines 470 even if one memory block includes two or more source lines 470.

Although the exemplary embodiments shown in FIGS. 1 to 6 describe a structure of a memory string UST where U-shape channels are formed and accordingly, source lines 470 and bit lines 510 are disposed in the upper ends of memory cells MC, the scope and spirit of the present invention are not limited to it, and the technology of the exemplary embodiments of the present invention may be applied to other three-dimensional non-volatile memory devices as well. This will be described hereafter with reference to FIG. 7.

Figure 7:
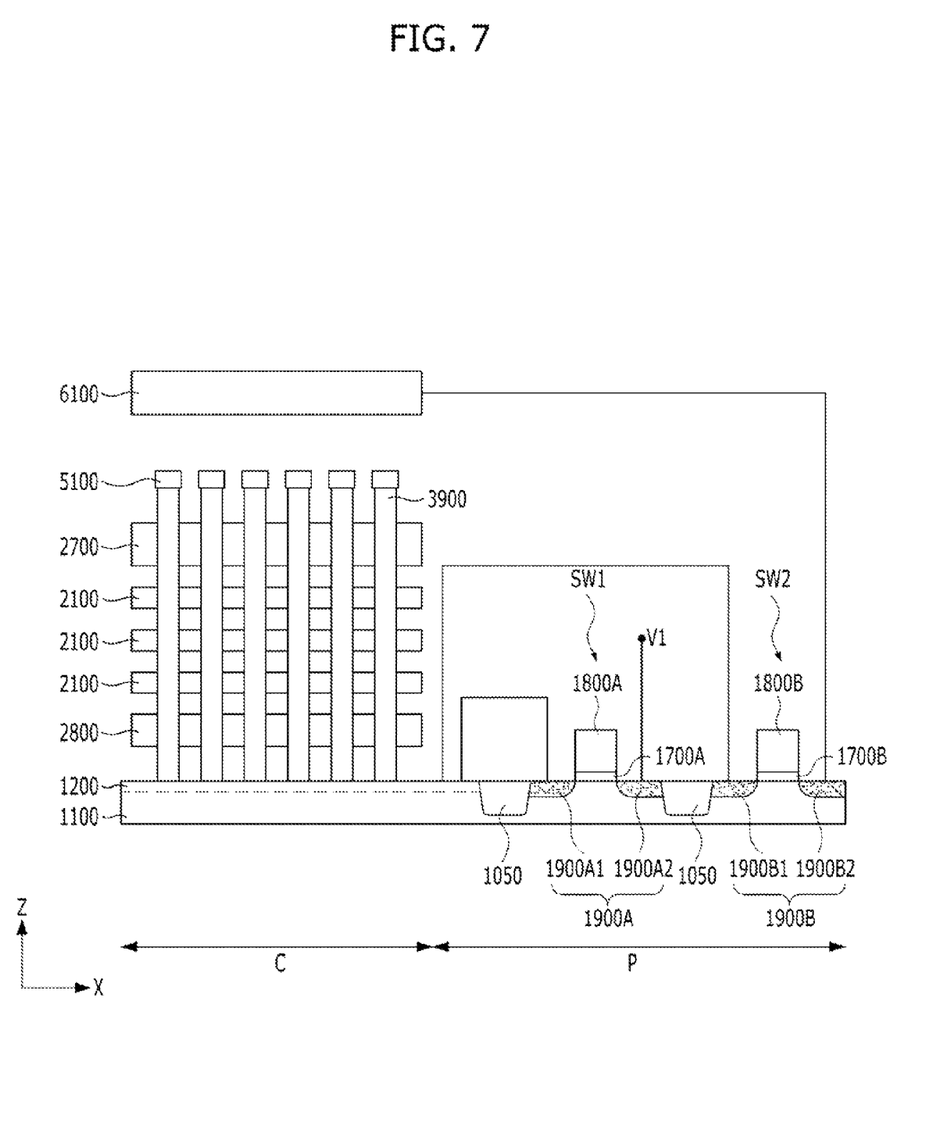
FIG. 7 is a cross-sectional view illustrating a non-volatile memory device in accordance with an exemplary embodiment of the present invention.

FIG. 7 is a cross-sectional view illustrating a non-volatile memory device in accordance with an exemplary embodiment of the present invention. This embodiment will be described hereafter mainly focusing on what is different from the exemplary embodiments shown in FIGS. 1-6.

Referring to FIG. 7, a source region 1200 may be disposed in a substrate 1100 of a first region C. The source region 1200 may be formed through an impurity doping process. Semiconductor pillars 3900 arrayed in an X direction and a Y direction while being stretched in a Z direction may be disposed over the source region 1200. The lower ends of the semiconductor pillars 3900 may contact the source region 1200, while the upper ends of the semiconductor pillars 3900 may contact bit lines 5100. Each bit line 5100 may be arrayed in the Y direction and coupled with semiconductor pillars 3900 that is stretched in the Y direction. A source selection line 2800, a plurality of word lines 2100 and a drain selection line 2700 may be stacked along the semiconductor pillars 390. An additional source line 6100 may be disposed over the bit lines 5100.

In this embodiment of the present invention, a first switch SW1 may be a transistor having a first gate electrode 1800A and first junctions 1900A formed on both sides of the first gate electrode 1800A. Specifically, the first gate electrode 1800A may be formed over an active region that is defined by an isolation layer 1050 in the substrate 1100 of a second region P, and a first gate insulation layer 1700A may be interposed between the active region and the first gate electrode 1800A. The first junctions 1900A may be formed in the active region on both sides of the first gate electrode 1800A. The first junctions 1900A may include a second source 1900A1 and a second drain 1900A2.

Similarly, a second switch SW2 may be a transistor having a second gate electrode 1800B and second junctions 1900B on both sides of the second gate electrode 1800B. A second gate insulation layer 1700B may be interposed between the active region and the second gate electrode 1800B. The second junctions 1900B may include a second source 1900B1 and a second drain 1900B2.

The first source 1900A1 of the first switch SW1 and the second source 1900B1 of the second switch SW2 in the second region P may be electrically connected to the source region 1200 formed in the substrate 1100 of the first region C.

This embodiment is different from the exemplary embodiments shown in FIGS. 1-6 in that the source region 1200 may be disposed under the memory cells, that is, in the substrate 1100. For this reason, the source selection line 2800 is disposed under the word lines 210, and a conductive pattern for coupling the source region 1200 with the first switch SW1 or the second switch SW2 may have a bent shape similar to an inverted U-shape π. Since the other features in FIG. 7 are substantially the same as those of the exemplary embodiments shown in FIGS. 1-6, detailed description on them is not provided herein.

According to an embodiment of the present invention, the operation characteristics of a non-volatile memory device may be improved.

While the present invention has been described with respect to the specific embodiments, it will be apparent to those skilled in the art that various changes and modifications may be made without departing from the spirit and scope of the invention as defined in the following claims.

What is claimed is:
1. A non-volatile memory device comprising:
a semiconductor pillar stretched perpendicularly to a substrate;
a plurality of memory cells stacked along the semiconductor pillar;

a bit line coupled with a first end of the semiconductor pillar;

a first source line coupled with one of the first end and a second end of the semiconductor pillar;

a second source line disposed over the bit line and the first source line and spaced apart from the bit line and the first source line;

a first switch having a first end coupled with the first source line and a second end coupled with a first voltage supplier, and controlling whether or not to supply a first voltage to the first source line; and a second switch having a first end coupled with the first source line so that the first end of the first switch and the first end of the second switch are commonly coupled with the first source line and a second end coupled with the second source line, and controlling whether or not to supply a second voltage supplied from the second source line to the first source line.

2. The non-volatile memory device of claim 1, wherein the semiconductor pillar includes a pair of a first semiconductor pillar and a second semiconductor pillar, the substrate includes a connecting unit for coupling a second end of the first semiconductor pillar with a second end of the second semiconductor pillar, the bit line is coupled with a first end of the first semiconductor pillar, and the first source line is coupled with a first end of the second semiconductor pillar.

3. The non-volatile memory device of claim 1, wherein the first source line is formed in the substrate to be coupled with the second end of the semiconductor pillar, and the bit line is coupled with the first end of the semiconductor pillar over the semiconductor pillar.

4. The non-volatile memory device of claim 1, wherein the second voltage includes a ground voltage.

5. The non-volatile memory device of claim 4, wherein, during a read operation the first voltage includes a ground voltage, and the first switch and the second switch are turned on.

6. The non-volatile memory device of claim 1, wherein, during a program operation or an erase operation, the first voltage includes a voltage required for the first source line to perform the program operation or the erase operation, and the first switch is turned on while the second switch is turned off.

7. The non-volatile memory device of claim 1, wherein the first source line includes a plurality of first source lines, the first switch and the second switch are coupled with each of the plurality of first source lines, and during an erase operation or a program operation, the first voltage is a voltage required for the first source line to perform the erase operation or the program operation, and the first switch coupled with a selected first source line of the plurality of first source lines is turned on while the first switch coupled with an unselected first source line is turned off.

8. The non-volatile memory device of claim 7, wherein the second switch coupled with each of the plurality of first source lines is turned off during the erase operation or the program operation.

9. The non-volatile memory device of claim 1, wherein the first source line includes a plurality of first source lines, the first switch and the second switch are coupled with each of the plurality of first source lines, and during a read operation, the first voltage and the second voltage are voltages required for the first source line to perform the read operation, and the first switch and the second switch coupled with each of the plurality of first source lines are turned on.

10. The non-volatile memory device of claim 1, wherein the first source line includes a plurality of first source lines that are included in each of a plurality of memory blocks, and the plurality of first source lines are coupled in common with one first switch and one second switch, and during an erase operation or a program operation, the first voltage is a voltage required for the first source line to perform the erase operation or the program operation, and the first switch coupled with a plurality of first source lines included in a selected memory block is turned on while the first switch coupled with a plurality of first source lines included in an unselected memory block is turned off.

11. The non-volatile memory device of claim 10, wherein the second switch is turned off during the erase operation or the program operation.

12. The non-volatile memory device of claim 1, wherein the first source line includes a plurality of first source lines that are included in each of a plurality of memory blocks, and the plurality of first source lines are coupled in common with one first switch and one second switch, and during a read operation, the first voltage and the second voltage are voltages required for the first source line to perform the read operation, and the first switch and the second switch are turned on.

13. The non-volatile memory device of claim 1, wherein each of the first switch and the second switch includes:
   a gate electrode formed over the substrate; and
   junctions formed in the substrate on both sides of the gate electrode.

14. The non-volatile memory device of claim 1, wherein the second source line does not contact the first source line.

15. A non-volatile memory device comprising:
   a memory string including a plurality of memory cells that are serially coupled between a bit line and a source line;
   a first switch having a first end coupled with the source line and a second end coupled with a source line voltage supplier for supplying a source line voltage required for the source line during a program operation, an erase operation, or a read operation, and controlling whether or not to supply the source line voltage to the source line; and
   a second switch having a first end coupled with the source line so that the first end of the first switch and the first end of the second switch are commonly coupled with the first source line and a second end coupled with a ground voltage supplier for supplying a ground voltage, and controlling whether or not to supply the ground voltage to the source line.

16. The non-volatile memory device of claim 15, wherein the first switch and the second switch are turned on during the read operation.

17. The non-volatile memory device of claim 15, wherein the first switch is turned on while the second switch is turned off during the program operation or the erase operation.

18. The non-volatile memory device of claim 15, wherein the source line includes a plurality of source lines, the first switch and the second switch are coupled with each of the plurality of source lines, and during the erase operation or the program operation, the first switch coupled with a selected source line of the plurality of source lines is turned on while the first switch coupled with an unselected source line is turned off.

19. The non-volatile memory device of claim 15, wherein the source line includes a plurality of source lines that are included in each of a plurality of memory blocks, and the plurality of source lines are coupled in common with one first switch and one second switch, and during the erase operation or the program operation, the first switch coupled with a plurality of source lines included in a selected memory block is turned on while the first switch coupled with a plurality of source lines included in an unselected memory block is turned off.

\* \* \* \* \*

UNITED STATES PATENT AND TRADEMARK OFFICE
CERTIFICATE OF CORRECTION

| | | |
|---|---|---|
| PATENT NO. | : 9,159,742 B2 | Page 1 of 1 |
| APPLICATION NO. | : 14/081699 | |
| DATED | : October 13, 2015 | |
| INVENTOR(S) | : Deung-Kak Yoo | |

It is certified that error appears in the above-identified patent and that said Letters Patent is hereby corrected as shown below:

ON THE TITLE PAGE

Change the References Cited section as follows:

FOREIGN PATENT DOCUMENTS

KR        1020110013700    *    2/2011

Signed and Sealed this
Eighth Day of March, 2016

Michelle K. Lee
*Director of the United States Patent and Trademark Office*